(12) United States Patent
Hirao

(10) Patent No.: US 7,236,374 B2
(45) Date of Patent: Jun. 26, 2007

(54) ENCLOSURE STRUCTURE OF ELECTRONIC APPARATUS AND ELECTRONIC APPARATUS

(75) Inventor: Hiroaki Hirao, Oume (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 50 days.

(21) Appl. No.: 11/108,318

(22) Filed: Apr. 18, 2005

(65) Prior Publication Data

US 2005/0236941 A1    Oct. 27, 2005

(30) Foreign Application Priority Data

Apr. 27, 2004   (JP)   ............ P2004-131902

(51) Int. Cl.
*H02B 1/01*   (2006.01)
(52) U.S. Cl. ............ 361/825; 361/752; 361/797
(58) Field of Classification Search ........ 361/752, 361/797, 683, 810
See application file for complete search history.

(56) References Cited

U.S. PATENT DOCUMENTS

| 5,264,986 | A |   | 11/1993 | Ohgami et al. |
|---|---|---|---|---|
| 5,316,491 | A |   | 5/1994 | Satou et al. |
| 5,402,309 | A |   | 3/1995 | Ohgami et al. |
| 5,513,069 | A |   | 4/1996 | Ohgami et al. |
| 5,526,227 | A |   | 6/1996 | Satou et al. |
| 7,036,667 | B2 | * | 5/2006 | Greenstein et al. ......... 206/723 |

FOREIGN PATENT DOCUMENTS

JP        3056719        3/1999

* cited by examiner

*Primary Examiner*—Tuan Dinh
*Assistant Examiner*—Hung S. Bui
(74) *Attorney, Agent, or Firm*—Blakely Sokoloff Taylor & Zafman

(57) ABSTRACT

In an enclosure structure of an electronic apparatus having a concave portion made up of a bottom wall and a surrounding wall, the concave portion being used for storing a functional part, an outer wall opposite to the surrounding wall of the concave portion, and a connecting wall connecting one end portion of the outer wall and one end portion of the concave portion, that is, in the integrally formed enclosure structure, a rib is provided over the surrounding wall of the concave portion, the outer wall, and the connecting wall, and a cut portion is provided at the other end portion opposite to one end portion connected to the connecting wall.

4 Claims, 3 Drawing Sheets

ENCLOSURE STRUCTURE OF ELECTRONIC APPARATUS AND ELECTRONIC APPARATUS

CROSS-REFERENCE TO RELATED APPLICATIONS

This application claims the benefit of priority of Japanese Patent Application No. 2004-131902, filed Apr. 27, 2004, the entire contents of which are incorporated herein by reference.

BACKGROUND

1. Field

The present invention relates to an enclosure structure of an electronic apparatus and to an electronic apparatus, and particularly to an enclosure structure of an electronic apparatus having ribs for reinforcing the enclosure and to an electronic apparatus.

2. Description of the Related Art

In an enclosure (exterior casing, housing, etc.) of an electronic apparatus such as a personal computer, etc., a substantially box-shaped concave portion for storing various functional parts, such as a battery pack, hard disk drive (HDD), extension memory, modem, wireless LAN module, key array (keyboard), etc., is integrally molded. Further, the concave portion is composed of a bottom wall and a surrounding wall. Furthermore, an outer wall is formed so as to enclose the concave portion and, in addition, a connecting wall for connecting the upper end portion of the outer wall and the upper end portion of the concave portion is integrally molded.

As a material for constituting the enclosure, generally a thermoplastic resin such as acrylic resin (ABS resin), etc., has been widely used. Furthermore, an injection molding method and a compression molding method are generally used for molding the enclosure from a viewpoint of being able to mold a lot of products (molded articles) each having a complicated shape quickly and to adopt automatic controlling system.

Furthermore, when the enclosure made up of the concave portion, the outer wall, and the connecting wall is constructed by using one thin continuous mold body, since the rigidity is decreased in the curved portion of a large curvature and the connecting wall of a large area of the enclosure, deformation is easily caused by surface shrinkage immediately after the molding process, and there is posed a problem in that the accuracy of the shape of molded products is lowered and the product yield is reduced due to visual defects.

Then, in order to solve the aforementioned problem of the decreasing rigidity of the enclosure, there has been also conventionally adopted an enclosure structure in which reinforcement ribs for connecting the external surface of the surrounding wall of a concave portion for storing the functional parts and the inner surface of the outer wall of the enclosure are formed.

Furthermore, as a conventional enclosure structure, there has been proposed a portable computer enclosure structure in which a thick-wall portion where the thickness of a wall portion of an enclosure is partially increased at a reinforcing position is formed, a pinhole is provided inside the thick-wall portion, a reinforcement rib is formed such that the thick-wall portion is expanded by injecting a gas into the pinhole, the width of the reinforcement rib is made larger than the wall thickness of the enclosure, and the rigidity is increased (for example, Japanese Registered Utility Model No. 3056719).

However, in the conventional molded enclosure structure of an electronic apparatus in which thick-wall portions are partially formed at reinforcing positions of an enclosure, pinholes are provided in those thick-wall portions, and reinforcement ribs are formed such that the thick-wall portions are expanded by injecting a gas into the pinholes, a high degree of technology is required to form the pinholes, it is difficult to form a thick-wall portion of a constant thickness, and there is a problem in that variations (scatterings) in the rigidity and strength of the enclosure increase.

On the other hand, in the conventional molded enclosure structure of an electronic apparatus in which the reinforcement ribs for connecting the outer surface of the surrounding wall of the concave portion and the inner surface of the outer wall of the enclosure are formed, there is a problem in that warpage and deformation of the enclosure caused by shrinkage at the time of molding and dimensional variations of the enclosure caused by surface shrinkage increase, and the production yield is disadvantageously reduced due to the inferior appearance of the products. In particular, in the enclosure in which a substantially box-shaped concave portion for storing the functional parts is integrally formed, since the substantially box-shaped concave portion has a relatively high rigidity at a time immediately after the molding, the outer surrounding portion of the enclosure is pulled in the direction of the concave portion through the reinforcement ribs due to shrinkage of the mold. As a result, the quality of the exterior appearance of the outer surrounding portion is likely to be degraded and deteriorated. That is, shrinkage is caused at the positions where the outer wall of the enclosure and the reinforcement ribs are connected, and there is posed a problem in that shrink marks, that is, surface irregularities are partially caused, thus resulting in visual defects.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION

Hereinafter, an enclosure structure of an electronic apparatus of an embodiment of the present invention is concretely described with reference to the accompanying drawings.

Figure 1:
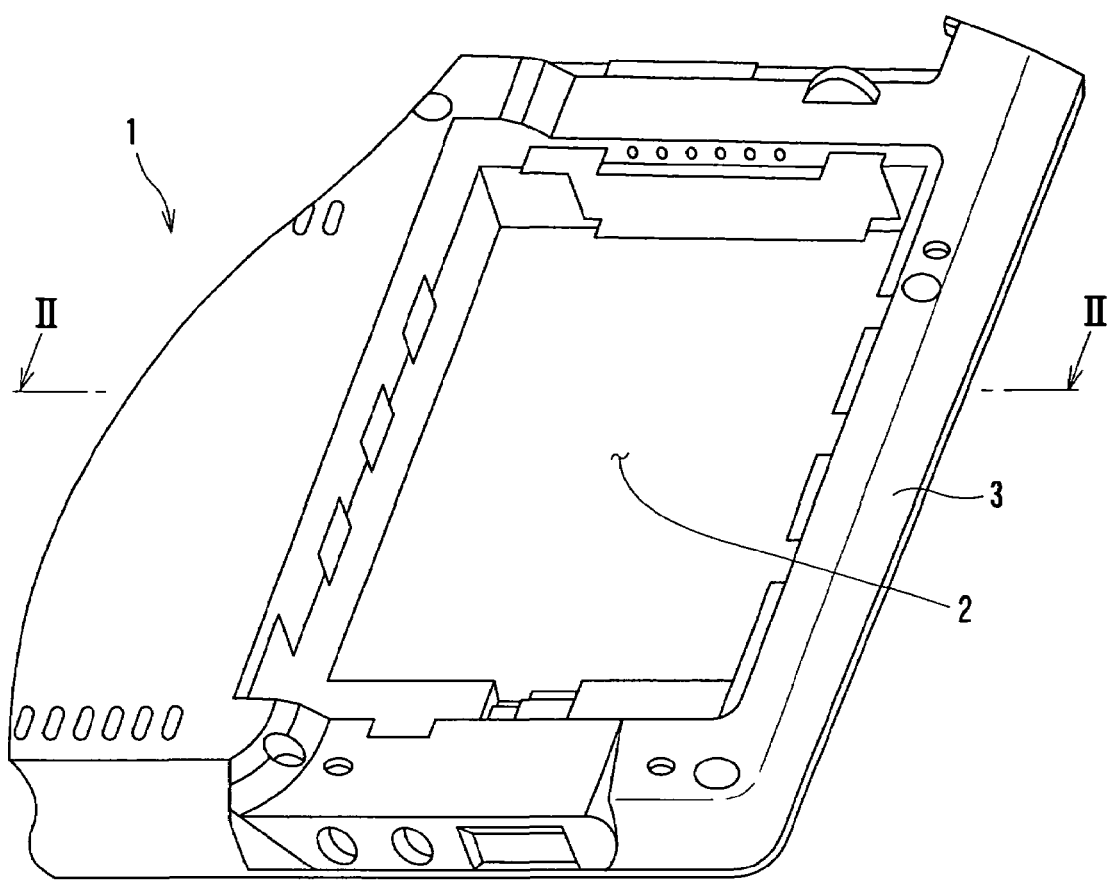
FIG. 1 is a perspective view showing an embodiment in which an enclosure structure of an electronic apparatus according to the present invention is applied to the lower casing of a casing made up of a pair of upper and lower casing members of a personal computer (PC) as an electronic apparatus, and also a perspective view showing the outer construction when an enclosure removed from an injection molding die made up of a cavity and a core is viewed from the cavity side (surface side)
Figure 2:
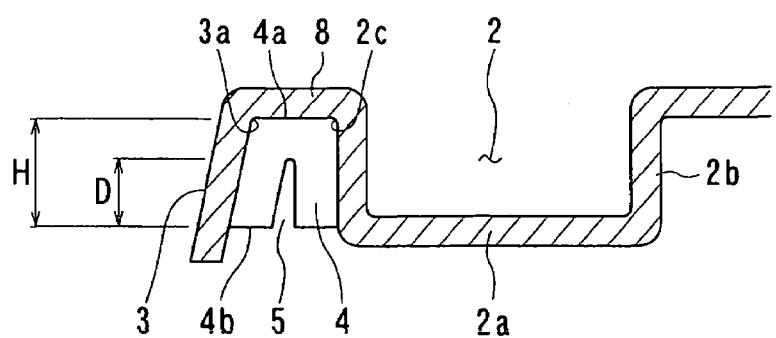
FIG. 2 is a partial sectional view taken on line II—II of FIG. 1 and viewed in the direction of the arrows.
Figure 3:
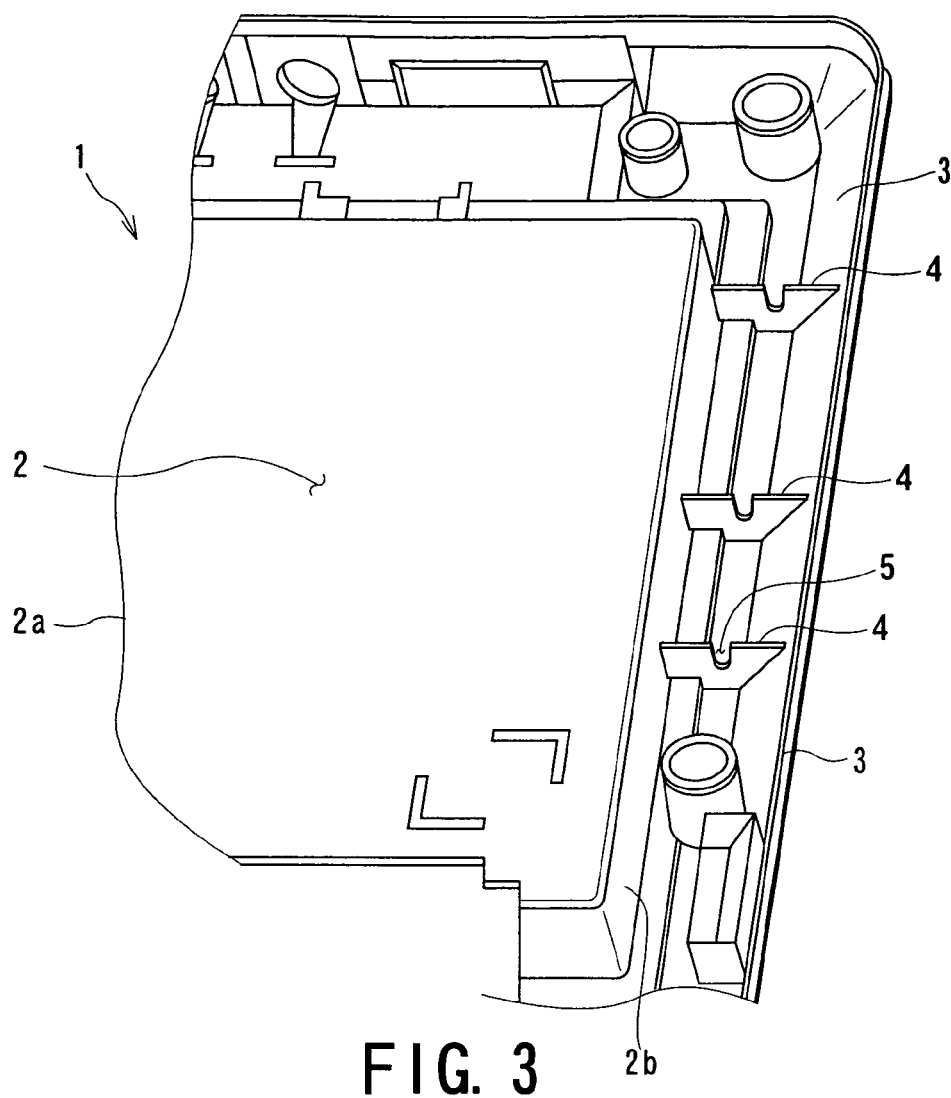
FIG. 3 is a perspective view showing the outer construction when the enclosure shown in FIG. 1 is viewed from the core side (bottom surface side) of the die.

FIG. 1 is a perspective view showing an enclosure structure of an electronic apparatus of an embodiment according to the present invention, which is applied to the lower casing member of a casing having a pair of upper and lower casing members of a personal computer (PC), serving as an electronic apparatus, and FIG. 1 is also a perspective view showing the outer construction when an enclosure removed from an injection molding die made up of a cavity and a core is viewed from the cavity side (surface side). FIG. 2 is a partial sectional view taken on line II—II of FIG. 1 and viewed in the direction of the arrows. FIG. 3 is a perspective view showing the outer construction when the enclosure shown in FIG. 1 is viewed from the core side (bottom surface side) of the die.

As shown in FIGS. 1 to 3, an enclosure 1 having the enclosure structure of the PC according to the present embodiment has an enclosure molding structure in which a substantially box-shaped concave portion 2 for accommodating a hard disk drive (HDD) serving as a functional part, an outer wall 3 formed so as to enclose the concave portion 2, and a connecting wall 8 connecting one end portion 3a (upper edge) of the outer wall 3 and one end portion 2c (upper edge) of the concave portion 2 are integrally molded. As shown in FIG. 2, the concave portion 2 is composed of a bottom wall 2a and a surrounding wall 2b extending vertically upward from the surrounding edge of the bottom wall 2a. Furthermore, the one end portion 3a of the outer wall 3 and the one end portion 2c of the concave portion 2 are connected by the connecting wall 8. Moreover, a plurality of reinforcement ribs 4 having a spacing therebetween is integrally provided in a space formed by the outer surface of the surrounding wall 2b of the concave portion 2, the inner surface of the outer wall 3, and the inner surface of the connecting wall 8. In addition, a cut portion 5 is formed at the other end portion 4b opposite to one end portion 4a, which is connected to the connecting wall 8, of the reinforcement rib 4.

The cut portion 5 formed in each of the reinforcement ribs 4 may be made U-shaped or V-shaped in section. However, in a V-shaped slit of an acute cut angle, since the possibility of occurrence of cracks due to stress concentration in the case of a large enclosure increases, a U-shaped cut portion having a smooth curve in section is more desirable. Moreover, as shown in FIG. 2, in an example according to the present embodiment, the depth D of a cut portion 5 formed in each reinforcement rib 4 is set to 60% of the height H of the reinforcement rib 4.

According to the enclosure structure of an example of an electronic apparatus of the present embodiment, at a time immediately after the molding, since the pulling force acting in the direction of the concave portion 2 due to the shrinkage of the outer wall 3 of the enclosure 1 through the reinforcement ribs 4 was effectively absorbed by the cut portion 5 formed in the reinforcement ribs 4, the external appearance of the outer wall 3 was not degraded, and the ratio of conforming products was 100%. That is, sink marks (shrink marks) were not caused at the portion where the outer wall 3 of the enclosure 1 was joined to the reinforcement ribs 4, surface irregularities where the surface of the outer wall 3 partially sinks were effectively prevented, and it was possible to easily manufacture an enclosure 1 having an excellent external appearance.

Furthermore, the outer wall 3 was able to be slowly bent by the action of the reinforcement ribs 4, and mold warpage of the outer wall 3 did not occur. Accordingly, the outer dimensions of the enclosure 1 were kept constant and the enclosure 1 was stably manufactured with a high degree of precision in shape thereof.

As another example, many enclosures having the concave portion and outer surrounding portion of the same dimensions were manufactured such that the depth D of the cut portion 5 formed in each reinforcement rib 4 was changed from 10% to 90% of the height H of the reinforcement rib 4, and the effect of the depth D of the cut portion 5 on the quality of external appearance was investigated. As a result, when the depth D of the cut portion 5 was less than 50% of the height H of the reinforcement rib 4, since the cut portion 5 did not fully absorb the shrinkage of the surface, sink marks were likely to occur and it was found that surface irregularities occurred where the surface of the outer wall partially sank.

On the other hand, when the depth D of the cut portion 5 exceeded 90% of the height H of the reinforcement rib 4, the amount of warpage of the outer surrounding portion exceeded the tolerance and it was confirmed again that the reinforcing effect of the reinforcement rib 4 on the enclosure rapidly decreased. Then, when the depth D of the cut portion 5 was in the range of 50% to 80% of the height H of the reinforcement rib 4, there were seldom cases where the reinforcing effect of the reinforcement ribs 4 on the enclosure was reduced, and it was verified that an enclosure having a high structural strength and superior external appearance could be obtained.

Figure 4:
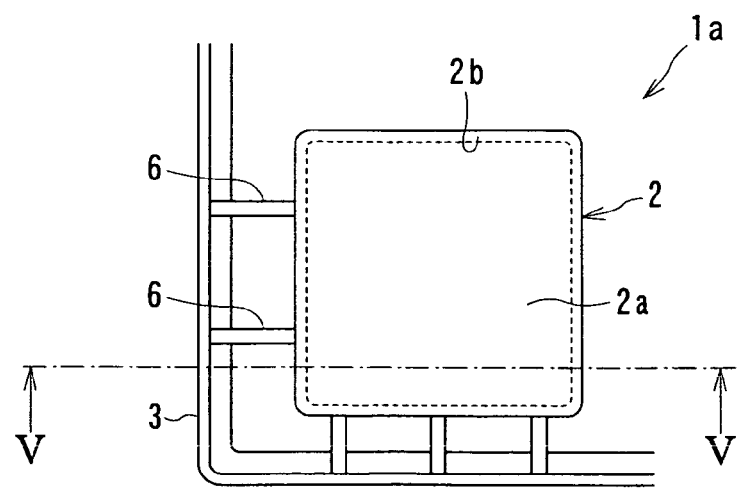
FIG. 4 is a top view showing an enclosure structure of an electronic apparatus according to a comparative example in which reinforcement ribs having no cut portion formed therein are integrally formed, and also a top view showing the outer construction when an enclosure removed from an injection molding die made up of a cavity and a core is viewed from the core side (bottom surface side)
Figure 5:
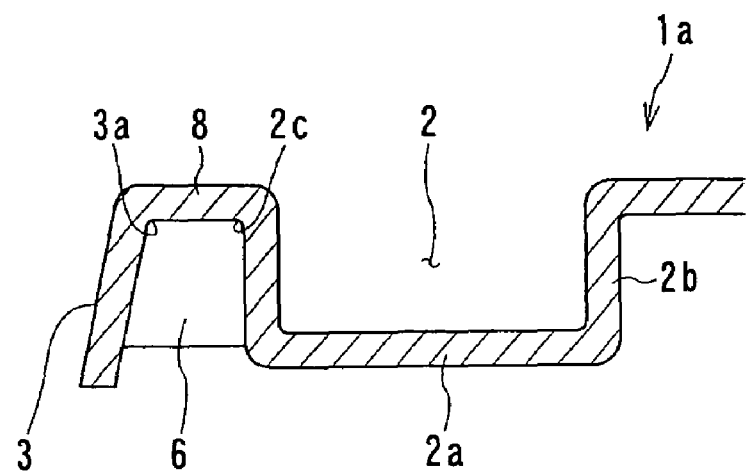
FIG. 5 is a partial sectional view taken on line V—V of FIG. 4.
Figure 6:
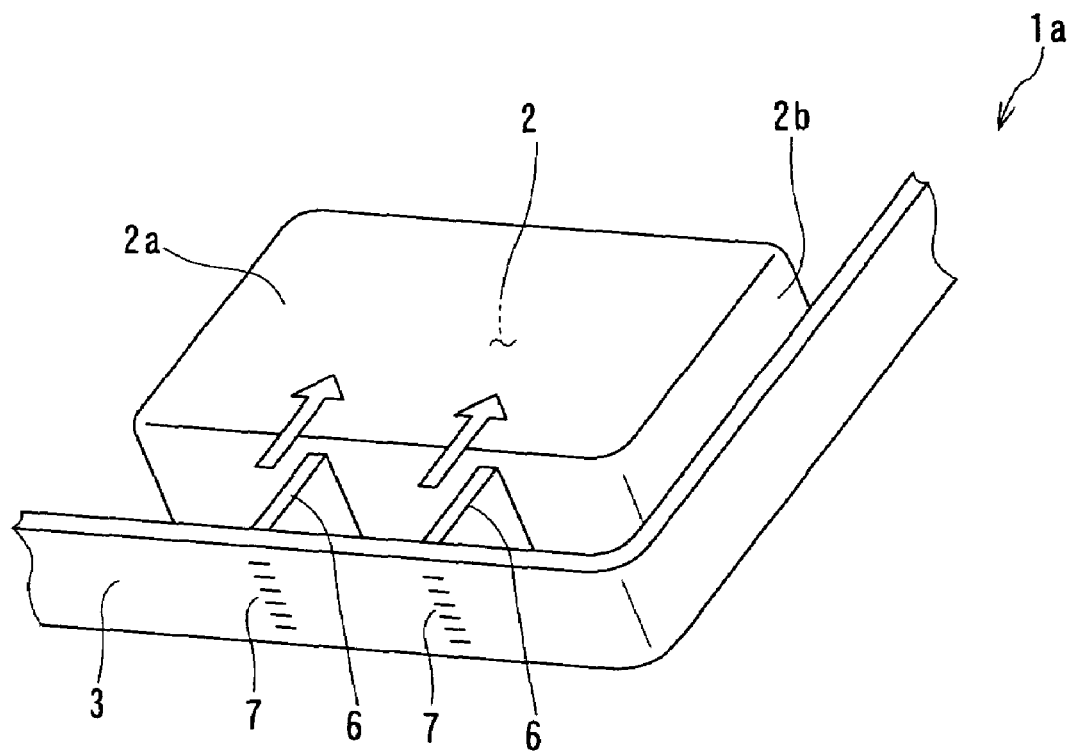
FIG. 6 is a perspective view showing the enclosure structure of an electronic apparatus according to a comparative example in which reinforcement ribs having no cut portion formed therein are integrally formed.

On the other hand, as shown in FIGS. 4 to 6, an enclosure 1a as a comparative example was produced in the same manner as in the examples according to the embodiment except that the cut portion was not formed. That is, as shown in FIG. 4, a plurality of reinforcement ribs 6 and 6 were integrally molded such that the outer surface of the substantially box-shaped concave portion 2 and the inner surface of the outer wall 3 were joined, but no cut portion was formed in the reinforcement ribs 6. Furthermore, as shown in FIG. 5, the concave portion 2 was composed of the bottom wall 2a and the surrounding wall 2b stood up from the surrounding edge of the bottom wall 2a. Furthermore, one end portion 3a of the outer wall 3 and one end portion 2c of the concave portion 2 were integrally molded so as to be connected by the connecting wall 8. Moreover, the reinforcement ribs 6, 6 having a spacing therebetween were provided in a space formed by the outer surface of the surrounding wall 2b of the concave portion 2, the inner surface of the outer wall 3, and the inner surface of the connecting wall 8.

In the enclosure 1a according to the comparative example, since no cut portion was formed in each of the reinforcement ribs 6 and there was no effect of absorbing the surface shrinking force by the action of the cut portion, the problem of warpage and deformation of the enclosure 1a caused by shrinkage at the time of molding and dimensional variations of the enclosure increases, and it was confirmed again that the quality of external appearance was degraded and the production yield of the enclosures was reduced. In particular, at a time immediately after the molding operation, the outer wall 3 of the enclosure 1*a* was pulled in the direction of the concave portion 2 by means of the reinforcement ribs 6 due to the mold shrinkage, and the quality of external appearance of the outer surrounding portion of the enclosure was degraded. That is, as is shown in FIG. 6, the shrinkage occurred at the portion where the outer wall 3 of the enclosure 1*a* was connected to the reinforcement ribs 6, and partial shrinkage of the outer surrounding surface, that is, the surface irregularities 7, was caused, thus resulting in defects in external appearance.

On the contrary, according to the enclosure structure of an electronic apparatus of the embodiments, since a very simple construction suffices for a die for forming the cut portion, the manufacturing cost of the die does not increase and the manufacturing cost of products can be reduced. Further, the secondary effect of preventing the metal protrusion portion in the die from collapsing and being deformed can be achieved. That is, as shown in FIG. 3, when a plurality of reinforcement ribs 4, 4 having a narrow spacing therebetween are integrally molded in the inner space of the enclosure 1, it is required to form a thin and high metal protrusion portion corresponding to the thickness and height of the reinforcement rib 4 in the main body of a molding die. However, even if the metal protrusion portion is constructed by using a strong and tough steel material, the pressure of a flowing resin at the molding operation repeatedly acts on the side face of the metal protrusion portion every time when the molding operation takes place and a pressure is repeatedly applied to the metal protrusion portion. Accordingly, the metal protrusion portion is likely to collapse and be deformed.

However, when a cut portion is formed in the reinforcement ribs as in the present embodiments, a metal portion for forming the cut portion is newly formed at the base of the metal protrusion portion for forming the main body of the reinforcement rib and a plurality of neighboring metal protrusion portions is firmly joined by the metal portion for forming the cut portion. Accordingly, a plurality of neighboring metal protrusion portions of a die is prevented from collapsing and being deformed and the durability of the die is greatly improved. Therefore, an advantage was afforded in that enclosures having high dimensional accuracy can be stably manufactured over an extended period of time.

According to the above embodiments, without damaging the reinforcing effect of the reinforcement ribs on an enclosure, the warpage and deformation of the enclosure due to shrinkage during the molding operation and dimensional variations of the enclosure because of the surface shrinkage can be reliably prevented. Accordingly, the quality of external appearance is improved and the reject rate of products (rate of defective products) can be reduced.

Moreover, the present invention is not limited to the above embodiments; the constituting elements can be changed and modified in concretely embodying the invention without departing from the spirit and scope of the invention. Furthermore, the invention can be practiced by appropriate combinations of a plurality of constituting elements disclosed in the above embodiments. For example, some of the constituting elements may be eliminated. Moreover, the constituting elements in different embodiments may be appropriately combined.

What is claimed is:

1. An enclosure structure of an electronic apparatus comprising:
   a concave portion which is used for storing a functional part, and includes a bottom wall and a surrounding wall;
   an outer wall opposite to said surrounding wall of the concave portion;
   a connecting wall connecting one end portion of said outer wall and one end portion of said concave portion;
   a rib provided over said surrounding wall of the concave portion, the outer wall, and the connecting wall; and
   a cut portion provided in the other end portion opposite to one end portion of said rib connected to the connecting wall.

2. An enclosure structure of an electronic apparatus as claimed in claim 1, wherein a depth of said cut portion is not less than 50% of the height of the rib.

3. An enclosure structure of an electronic apparatus as claimed in claim 1, wherein a depth of the cut portion is between 50% and 80% of the height of the rib.

4. An electronic apparatus comprising:
   an enclosure including a concave portion having a bottom wall and a surrounding wall, the concave portion being used for storing a functional part so as to load and unload the functional part, an outer wall opposite to said surrounding wall of the concave portion, and a connecting wall for connecting one end portion of the outer wall and one end portion of the concave portion;
   a rib provided over the surrounding wall of the concave portion, the outer wall, and the connecting wall; and
   a cut portion provided in the other end portion opposite to one end portion of the rib connected to the connecting wall.

* * * * *